United States Patent [19]
Goel et al.

[11] Patent Number: 5,838,214
[45] Date of Patent: Nov. 17, 1998

[54] UNITARY PACKAGING SYSTEM FOR A CAPACITOR AND INDUCTOR

[75] Inventors: Sanjay Goel, Schaumburg; Darioush Keyvani, Chicago; Girish R. Harshe, Wheeling; John E. Nerz, Hawthorn Woods; Marc Chason, Schaumburg, all of Ill.

[73] Assignee: Motorola, Inc., Schaumburg, Ill.

[21] Appl. No.: 676,611

[22] Filed: Jul. 8, 1996

[51] Int. Cl.[6] .................................................. H03H 7/09
[52] U.S. Cl. ........................ 333/177; 333/184; 333/185
[58] Field of Search .................................. 333/167, 177, 333/181, 184, 185

[56] References Cited

U.S. PATENT DOCUMENTS

| | | | |
|---|---|---|---|
| 1,616,180 | 2/1927 | Field | 333/177 X |
| 2,227,384 | 12/1940 | Wiessner | 333/177 |
| 2,937,348 | 5/1960 | Ness | 333/184 |
| 3,411,104 | 11/1968 | Pintell | 333/185 X |
| 4,746,557 | 5/1988 | Sakamoto et al. | 428/138 |
| 5,453,316 | 9/1995 | Morii et al. | 428/210 |
| 5,526,223 | 6/1996 | Wu et al. | 361/501 |

FOREIGN PATENT DOCUMENTS

| | | | |
|---|---|---|---|
| 2-30311 | 12/1990 | Japan | 333/185 |
| 4-137904 | 5/1992 | Japan | 333/181 |
| 4-267615 | 9/1992 | Japan | 333/181 |

*Primary Examiner*—Robert Pascal
*Assistant Examiner*—Justin P. Bettendorf
*Attorney, Agent, or Firm*—Scott M. Garrett; Kelly A. Gardner

[57] ABSTRACT

A capacitor (14) is disposed in, for example, a ferrite shell (12). A winding (20) is formed around the shell, thereby providing an inductive component. Additional windings may be provided to form a transformer. In combining the two components into a unitary package, a space savings is realized, and assembly efficiency is increased.

18 Claims, 2 Drawing Sheets

UNITARY PACKAGING SYSTEM FOR A CAPACITOR AND INDUCTOR

TECHNICAL FIELD

The invention relates in general to packages for electrical components, and in particular to a package combining a capacitor and an inductive component.

BACKGROUND

Modern electrical devices are assembled from a wide variety of components. Many different sizes and packages are available. However, as devices are increasingly made smaller and more portable, it is desirable to choose components that facilitate small size. In many devices a common circuit element is a switching power supply or power regulator. These circuits can be designed in a wide range of topologies, but always use an inductive component and a filter capacitor. Both of these components are relatively large, and take up a large proportion of the available space in a given device.

Furthermore, these components tend to be difficult to handle during assembly, compared to other circuit components such as resistors and integrated circuit packages. Material handling is a critical manufacturing process, and considerations need to be taken to ensure high yields. Due to the relatively large size of filter capacitors and inductive components such as transformers, these components typically require a different process to be assembled into the device than other smaller components. In many devices, these may be the only leaded components, the rest being surface mounted type components. It would be desirable to reduce the extra processes required to assemble such devices.

Therefore there exists a need for a packaging system that reduces the overall space required for these components, and moreover, that decreases the handling necessary to assemble these components into a given device.

DETAILED DESCRIPTION OF THE PREFERRED EMBODIMENT

Figure 1:
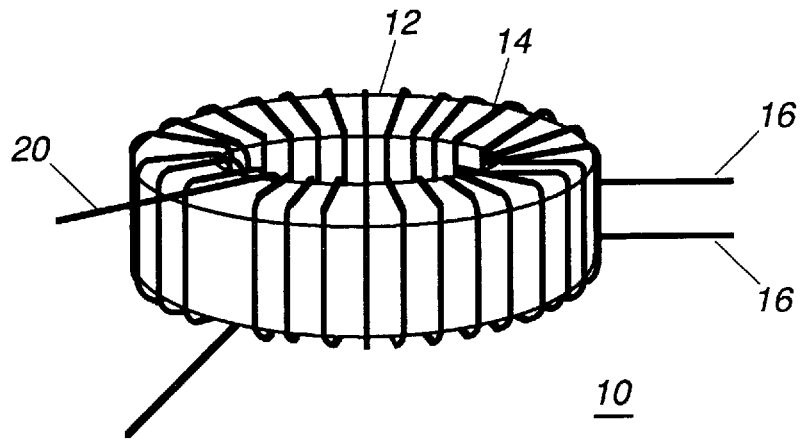
FIG. 1 is a perspective view of a unitary packaging system in accordance with a first embodiment of the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein a perspective view of a unitary packaging system 10 in accordance with a first embodiment of the invention. In this particular embodiment, the packaging system is in the form of a toroidal shell 12, which acts as a means for holding a capacitor 14 therein, shown in phantom in this illustration. To increase the inductive effect, it is preferred that the shell is also a means for storing magnetic flux magnetic flux, such as a ferrite material. The capacitor has electrical contacts 16 that extend through the shell for making electrical connections with other circuit components. Disposed around the shell is at least one electric current carrying member having at least one turn around the shell, such as a winding 20. The winding 20 forms an inductive component. It is preferred that the means for holding the capacitor is fabricated of a magnetic flux storing material to enhance the inductance of the winding, however it will be appreciated by those skilled in the art that the winding inherently has inductive properties and an inductance value, regardless of the material disposed therein.

Figure 2:
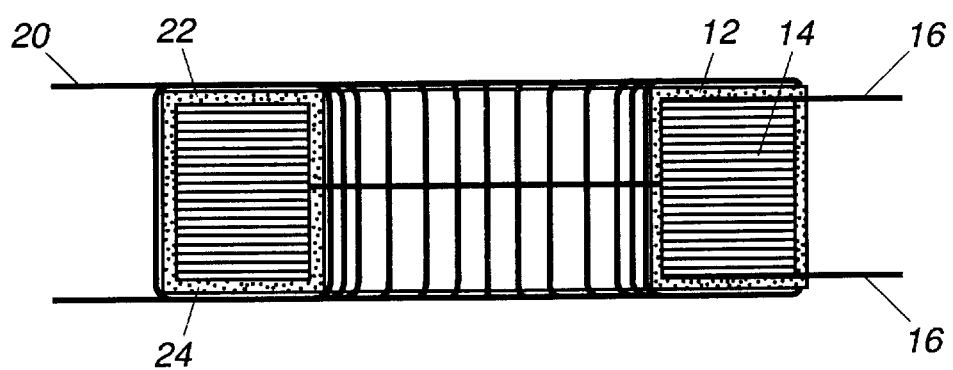
FIG. 2 is a side cut away view of a unitary packaging system in accordance with a first embodiment of the invention.

FIG. 2 illustrates a side cut away view of the packaging system illustrated in FIG. 1. From this illustration the capacitor 14 can clearly be seen. In general, the capacitor is a multi-layer stack, as is common in the art. It is contemplated that the capacitor is of the electrochemical variety. That is, a capacitor wherein electric charge is stored in a chemical system, as opposed to a typical capacitor where electric energy is stored in the electric field of a dielectric material. Electrochemical capacitors provide large capacitance values in much less volume than conventional capacitors, and are therefore preferred. Other types of capacitors that may also be utilized include double layer capacitors and electrolytic capacitors. In general, a means for holding the capacitor is comprised of a first portion 22 and a second portion 24. In this embodiment the first and second portions are formed of ferrite in a toroidal shell configuration.

By combining an inductive element and a capacitor in a unitary packaging system in accordance with the invention, several advantages are realized. Chief among these is the savings in space, or surface area realized by combining the two into one package, as opposed to having both components separate. Although the same volume may be required, the surface area required will be reduced in most cases. Furthermore, there is an advantage in assembly. Instead of having to buy, stock, handle, and assemble two separate components, by combining them into one package that effort is essentially halved.

Figure 3:
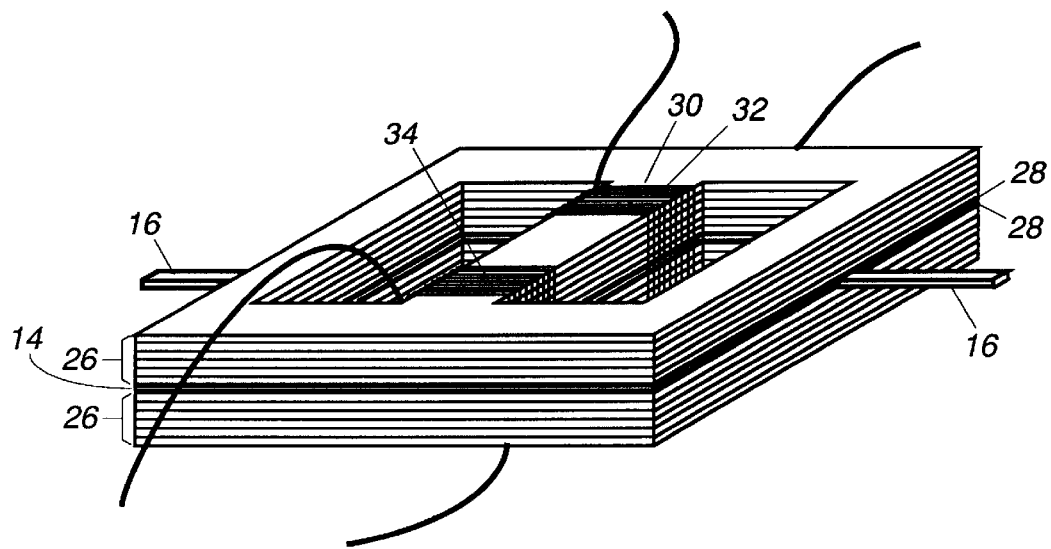
FIG. 3 is a perspective view of a unitary packaging system in accordance with a second embodiment of the invention.

Referring now to FIG. 3, there is illustrated therein a perspective view of a unitary packaging system 10 in accordance with a second embodiment of the invention. In this embodiment, a capacitor 14 is held between portions of an inductive component, comprised of a plurality of ferrous plates 26, as is common in the art. The capacitor has electrical contacts 16 that extend beyond the plates. Between the capacitor and the plates, it is preferred that a layer of insulating material 28, such as tape, is disposed. The plates form a center core 30 about which a primary winding 32 and a secondary winding 34 are disposed, thereby forming a transformer.

Figure 4:
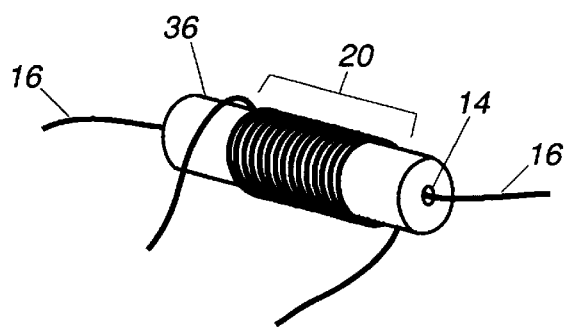
FIG. 4 is a perspective view of a unitary packaging system in accordance with a third embodiment of the invention.

Referring now to FIG. 4, there is illustrated therein a perspective view of a unitary packaging system in accordance with a third embodiment of the invention. This embodiment shows the use of a ferrite shell in the form of a ferrite rod 36 for holding the capacitor 14. The rod has a bore forming a cavity through the rod, and the capacitor is rolled to fit inside the bore. As before, the capacitor has electrical contacts 16 extending beyond the shell, and a winding 20 disposed about the rod.

In practicing the invention, there are a variety of ways of implementing the different structures. For example, in forming the means for holding the capacitor, it is contemplated that a plastic may be mixed with a ferrite material, thereby providing a moldable plasto-ferrite. Such a material can be molded into, for example, a toroidal shape with the first and second portions illustrated in FIG. 2. It is also contemplated that sintered ferrite be used, as is conventional in the art. A transformer may be constructed using the toroidal shaped member, illustrated in FIG. 2. 1–2 simply by adding a secondary winding. In addition, more than two windings may be used in any of the embodiments illustrated to obtain a power converter with either multiple outputs, an auxiliary power source for driving input electronics on the primary side, or both.

The resulting device formed by packaging an inductive component with a capacitor has wide range of possible uses in power electronics. For example, in switching power converters, transformers are used to transfer energy from an input to an output. Typically an input voltage is "stepped down", but transformers are also used to step up voltage, and also for isolation where the voltage remains the same. In such switching power converter large value capacitor are used to provide bulk filtering. That is, the capacitor is connected in parallel with the output winding to reduce the voltage ripple caused by the switching of voltage through the transformer. In addition, it is common to use a series choke or inductor filter on the output of a switching power supply to reduce current ripple. By packaging what are typically the largest components in a power regulation circuit together, a significant space savings may be realized. Furthermore, as mentioned hereinabove, the assembly efficiency of constructing a power converter is enhanced.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A unitary packaging system for a capacitor and an inductive component, comprising:
    a capacitor having electrical contacts;
    means for holding said capacitor, said electrical contacts extending beyond said means for holding outside said unitary packaging system; and
    at least one electric current carrying member having at least one turn around said means for holding to form an inductor, said inductor having electrical contacts distinct from the electrical contacts of the capacitor and extending outside said unitary packaging system.

2. A unitary packaging system as defined by claim 1, wherein said capacitor is an electrochemical capacitor.

3. A unitary packaging system as defined by claim 1, wherein said means for holding is fabricated of a magnetic flux storing material.

4. A unitary packaging system as defined by claim 3, wherein said magnetic flux storing material is ferrite.

5. A unitary packaging system as defined by claim 3, wherein said magnetic flux storing material is a plurality of ferrous plates.

6. A unitary packaging system as defined by claim 1, wherein said means for holding is a toroidal shell.

7. A unitary packaging system as defined by claim 1, wherein said at least one electrical current carrying member is wound about said means for holding and about said capacitor included within said means for holding.

8. A unitary packaging system for a capacitor and an inductive component, comprising:
    a shell having a cavity formed therein;
    a capacitor, disposed in said cavity, and having electrical contacts extending through said shell outside said unitary packaging system; and
    at least one winding disposed around said shell and around said capacitor disposed within said shell to form the inductive component, said inductive component having electrical contacts separate from the electrical contacts of the capacitor and extending outside said unitary packaging system.

9. A unitary packaging system as defined by claim 8, wherein said shell is a ferrite shell.

10. A unitary packaging system as defined by claim 8, wherein said shell is a ferrite rod having a bore for providing said cavity.

11. A unitary packaging system as defined by claim 8, wherein said capacitor is an electrochemical capacitor.

12. A unitary packaging system as defined by claim 8, wherein said shell comprises a plurality of ferrous plates between which the capacitor is held, and wherein said at least one winding comprises a primary winding and a secondary winding disposed around a center core of said plurality of ferrous plates.

13. A unitary packaging system for a capacitor and an inductive component, comprising:
    a means for storing magnetic flux;
    a capacitor substantially surrounded by said means for storing magnetic flux, said capacitor having first and second electrical contacts extending through said means for storing magnetic flux outside said unitary packaging system; and
    at least one winding disposed around said means for storing magnetic flux and around said capacitor, said at least one winding forming said inductive component, which has third and fourth electrical contacts extending outside said unitary packaging system and distinct from said first and second electrical contacts.

14. A unitary packaging system as defined by claim 13, wherein said capacitor is an electrochemical capacitor.

15. A unitary packaging system as defined by claim 13, wherein said means for storing magnetic flux is ferrite.

16. A unitary packaging system as defined by claim 13, wherein said means for storing magnetic flux is a plurality of ferrous plates.

17. A unitary packaging system as defined by claim 15, wherein said ferrite is formed into a toroidal shell.

18. A unitary packaging system as defined by claim 13, wherein said at least one winding comprises at least a primary winding and a secondary winding.

* * * * *